United States Patent
Colgan et al.

(10) Patent No.: US 8,916,959 B2
(45) Date of Patent: Dec. 23, 2014

(54) PACKAGING STRUCTURE

(71) Applicant: International Business Machines Corporation, Armonk, NY (US)

(72) Inventors: Evan G. Colgan, Chestnut Ridge, NY (US); Paul W. Coteus, Yorktown, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 13/721,991

(22) Filed: Dec. 20, 2012

(65) Prior Publication Data

US 2014/0175635 A1 Jun. 26, 2014

(51) Int. Cl.
- H01L 23/02 (2006.01)
- H01L 23/52 (2006.01)
- H01L 23/48 (2006.01)
- H01L 27/146 (2006.01)
- H01L 23/538 (2006.01)
- H01L 23/00 (2006.01)

(52) U.S. Cl.
CPC ............ H01L 23/5386 (2013.01); H01L 24/00 (2013.01)
USPC .................... 257/686; 257/777; 257/E27.137

(58) Field of Classification Search
CPC .......................... H01L 23/5386; H01L 24/00
USPC ........................ 257/737, 686, 777, E27.137
See application file for complete search history.

(56) References Cited

U.S. PATENT DOCUMENTS

| | | | |
|---|---|---|---|
| 5,949,135 A | 9/1999 | Washida et al. | |
| 7,009,296 B1 * | 3/2006 | Heo | 257/738 |
| 7,122,400 B2 | 10/2006 | Hanke | |
| 7,317,250 B2 | 1/2008 | Koh et al. | |
| 7,348,795 B2 | 3/2008 | Scheppler et al. | |
| 7,477,535 B2 | 1/2009 | Lahtinen et al. | |
| 7,642,173 B2 | 1/2010 | McDonald | |
| 7,642,633 B2 | 1/2010 | Hirose et al. | |
| 7,714,447 B2 | 5/2010 | Eigner et al. | |
| 7,994,501 B2 | 8/2011 | Drost et al. | |
| 8,178,416 B2 | 5/2012 | Simon et al. | |
| 2011/0285007 A1 | 11/2011 | Chi et al. | |
| 2011/0309495 A1 * | 12/2011 | Wang et al. | 257/737 |

FOREIGN PATENT DOCUMENTS

| | | |
|---|---|---|
| CN | 101552214 A | 10/2009 |
| JP | 3880676 A | 9/1998 |

* cited by examiner

Primary Examiner — Luan C Thai
(74) Attorney, Agent, or Firm — Cantor Colburn LLP; William Stock

(57) ABSTRACT

A packaging structure is provided. The packaging structure includes first and second chips, at least one surface of each of the first and second chips being an active surface and a common chip to which at least one of the first and second chips is electrically interconnected. The respective active surfaces of the first and second chips are directly electrically interconnected to one another in a face-to-face arrangement and are oriented transversely with respect to the common chip.

23 Claims, 5 Drawing Sheets

PACKAGING STRUCTURE

BACKGROUND

The present invention relates to a packaging structure. More specifically, the present invention relates to a packaging structure with direct electrical connections between respective active surfaces of first and second chips and between at least one of the first and second chips and a common chip.

As complementary-metal-oxide-semiconductor (CMOS) device scaling has been reduced, chip stacking methods have been explored as options for increasing system performance. In some cases, chip stacks include multiple chips arranged side-by-side to form a block with a common chip disposed at a side of the block. The block is then connected along a side of the block opposite from the common chip to a wiring board.

In chip stacks that include the common chip and multiple chips arranged in the side-by-side configuration, a large amount of silicon can be packaged and interconnected. However, the interconnections through the common (i.e., top) chip are limited by corner crossing densities. Moreover, power delivery to the common chip can be challenging since the direction of the power delivery is oriented vertically along the vertical lengths of each of the multiple chips.

SUMMARY

According to one embodiment of the present invention, a packaging structure is provided and includes first and second chips, at least one surface of each of the first and second chips being an active surface and a common chip to which at least one of the first and second chips is electrically interconnected. The respective active surfaces of the first and second chips are directly electrically interconnected to one another in a face-to-face arrangement and are oriented transversely with respect to the common chip.

According to another embodiment, a packaging structure is provided and includes first and second chips, each of the first and second chips including a body having two opposing surfaces and four sidewalls extending between the two opposing surfaces, at least one of the two opposing surfaces of each of the first and second chips being an active surface and a common chip to which at least one of the respective sidewalls of the first and second chips is electrically interconnected. The respective active surfaces of the first and second chips are directly electrically interconnected to one another in a face-to-face arrangement and are oriented transversely with respect to the common chip.

According to another embodiment, a packaging structure is provided and includes chip sets of at least first and second chips, at least one surface of each of the first and second chips of each chip set being an active surface The respective active surfaces of the first and second chips of each of the chip sets are directly electrically interconnected to one another in a face-to-face arrangement.

According to another embodiment, a packaging structure is provided and includes first and second chip sets, each chip set including at least first and second chips, at least one surface of each of the first and second chips of each chip set being an active surface, the respective active surfaces of the first and second chips of each of the chip sets being directly electrically interconnected to one another in a face-to-face arrangement and a bonding layer by which the first and second chip sets are attached to one another.

According to another embodiment, a method of assembling a packaging structure is provided and includes directly electrically interconnecting respective active surfaces of first and second chips in a face-to-face arrangement, electrically interconnecting respective sidewalls of at least one of the first and second chips to a common chip and orienting the respective active surfaces of the first and second chips transversely with respect to the common chip.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 is a side view of the packaging structure of FIG. 1 showing a power conversion chip face on;

DETAILED DESCRIPTION

In a chip stack, such as a 4Di chip stack, a large amount of silicon in the form of multiple chips arranged side-by-side with a common (top) chip can be packaged and interconnected to provide for an area multiplier of about 8.5× or more with 57.6 k connections for both power and signals between the 4Di chip stack and the common chip. The interconnection through the common chip may however be limited by corner crossing densities and power delivery to the common chip may be challenging since the power delivery is oriented vertically along the vertical lengths of each of the multiple chips.

In accordance with the embodiments described herein, a chip stack is provided and may be embodied as a 4Di chip stack including multiple chips arranged in at least active surface-to-active surface (i.e., face-to-face) groupings with conductive elements, such as small pitch microbumps or microjoins, disposed between them. This provides for relatively high bandwidth connection between chip pairs (or, more generally, groupings of two or more chips) and could be used, for example, to attach a power conversion or memory chip or a chip containing integrated passive devices, such as decoupling capacitors or inductors, to a processor chip. This also effectively doubles the active area of a chip that can be tightly electrically interconnected with other modules. In addition, the chip stack may provide for at least 28.8 k connections between the chips in each chip pair and 30 or more chip pairs such that the total connections for the chip stack is at least 864 k. Furthermore, the use of facing chip pairs may be advantageous as symmetrical arrangements will cause any stress induced bowing to be cancelled out.

Figure 1:
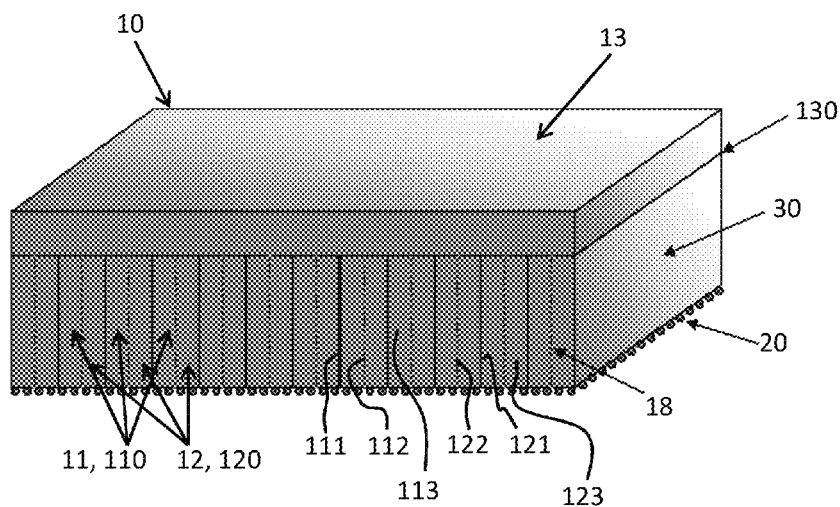
FIG. 1 is a perspective view of a packaging structure according to embodiments.
Figure 2:
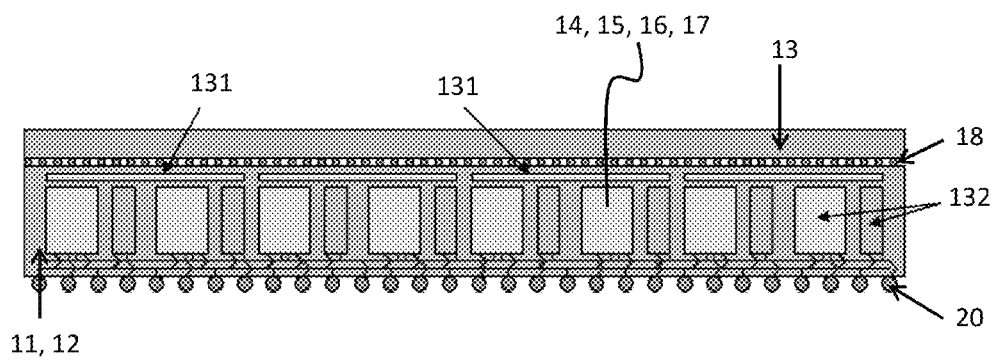

With reference now to FIGS. 1 and 2, a packaging structure 10 is provided as an exemplary chip stack. The packaging structure 10 includes at least one or more pairs of a first chip 11, a second chip 12 and, in some cases, a common chip 13 that is connectable with at least one of the first and second chips 11 and 12 of each of the one or more chip pairs. At least one of the first and second chips 11 and 12 includes at least one of a voltage conversion device 14, a control device 15 and a memory device 16. At least one of the first and second chips 12 and 13 may also include a power conversion chip 17 that is configured to convert an input voltage into a first voltage domain to power the other of the first and second chips 11 and 12, and a second voltage domain to power the common chip 13 when the common chip 13 is in use.

The first chip 11 includes a first chip body 110 having two opposing surfaces 111, at least one of which is an active surface 112, and four sidewalls 113. The four sidewalls 113 extend between the two opposing surfaces 111. The second chip 12 similarly includes a second chip body 120 having two opposing surfaces 121, at least one of which is an active surface 122, and four sidewalls 123. Again, the four sidewalls 123 extend between the two opposing surfaces 121. Although the first and second chips 11 and 12 are illustrated as being rectangular, it will be understood that this is merely exemplary and that other configurations are possible. For the exemplary rectangular case, the first and second chips 11 and 12 may be oriented such that one of the sidewalls 113 and 123 is a "top" sidewall 113, 123 and the opposite one is a "bottom" sidewall 113, 123.

For each pair of chips, at least one of the respective sidewalls 113 and 123 (i.e., the "top" sidewalls 113 and 123) of the first and second chips 11 and 12 is electrically interconnected (or at least configured to be electrically interconnected) to an active surface 130 of the common chip 13 via, for example, 25 micron (μm) pitch corner crossings. That is, in one particular configuration, corner crossings are only provided between the first chip 11 or the second chip 12 and the common chip 13 via 25 micron pitch corner crossings so only one chip is directly connected to the common chip 13 with the other chip being indirectly connected to the common chip 13.

In addition, the respective active surfaces 112 and 122 of the first and second chips 11 and 12 are directly electrically interconnected to one another in an active surface-to-active surface arrangement (hereinafter referred to as a "face-to-face" arrangement). The respective active surfaces 112 and 122 of the first and second chips 11 and 12 are oriented transversely with respect to a plane of the active surface 130 of the common chip 13. An array of controlled collapse chip connections (C4s) 20 may be provided between, for example, a $1^{st}$ level package substrate (see reference numeral 201 of FIG. 6) and other respective sidewalls 113 and 123 (i.e., the "bottom" sidewalls 113 and 123) of the first and second chips 11 and 12. Wider pitch corner crossings, around 100 microns pitch for example, are provided to electrically interconnect the active surfaces 112 and 122 of first and second chips 11 and 12 to corresponding bottom sidewalls 113 and 123 and the array of C4 20.

Bowing in one of the first and second chips 11 and 12 may be cancelled out by corresponding bowing in the other of the first and second chips 11 and 12. Alternatively, bowing may be corrected or braced against by the other of the first and second chips 11 and 12.

At least one of microbumps 18 or microjoins may be disposed between the first and second chips 11 and 12. For purposes of clarity and brevity, the non-limiting microbump 18 embodiment will be described herein but this is not meant to be limiting or exclusive. The microbumps 18 may be provided with, for example, a 50 μm pitch and may serve as electrical conductors by which the respective active surfaces 112 and 122 of the first and second chips 11 and 12 are directly electrically interconnected to one another. In accordance with embodiments, microbumps 18 may also be interposed between the first and second chips 11 and 12 and the common chip 13 with 75 μm pitch.

For the embodiment in which at least one of the first and second chips 12 and 13 includes the power conversion chip 17 configured to convert an input voltage into the first and second, or more, voltage domains to respectively power the other of the first and second chips 11 and 12 and the common chip 13, the first and second, or more voltage domains may be independent. In addition, it will be understood that with this arrangement, there would be a minimal resistive voltage (I×R) loss in the microbumps 18 between the electrically interconnected first and second chips 11 and 12. For the common chip 13, voltage or power conversion regions 131 could be provided along the "top" edge of the respective active chip surface 112 or 122 and power conversion regions 132 for the facing chip in the joined pair would be provided below regions 131 on the respective active chip surface 112 or 122 of the power conversion chip 17 (see FIG. 2). Thus, current transferred to the common chip 13 may be transferred through corresponding corner crossings and microbumps 18. The voltage conversion device 14 and the control device 15 may be embodied, for example, as switched capacitor power supplies or buck converters power supplies.

In accordance with embodiments, the first and second chips 11 and 12 may be provided in chip pairs. The chip pairs could either be formed by bonding wafers together or by bonding together individual chips. The wafer bonding approach would be appropriate for cases where the chip yield is high, as a defective chip on either wafer would result in a defective chip pair. With an individual chip process, a known good die could be selected from each parent wafer and then assembled. Depending on the assembly yield, it may be desirable to test the chip pairs prior to assembly into a chip stack (i.e., a 4Di module). This could be accomplished in the individual chip process by making one chip slightly smaller than the other in at least on dimension and would result in making probe pads available for testing. The probe pads could then be subsequently filled by the addition of a "filler" piece of silicon. A variant of this process may be possible for the wafer bonding case by dicing an edge off one chip and using TCA (temporary chip attach; under size pad) type join pads so that the test pads can be exposed by removing the diced chip piece and then adding back a "filler" piece of silicon. The filler edge should be slightly inside of the bottom chip edge to allow for precision assembly of the 4Di chip stack.

Figure 3:
FIG. 3 is a perspective view of a chip set in accordance with embodiments.
Figure 4:
FIG. 4 is a perspective view of the chip set of FIG. 3 with a filler added.

An embodiment of the process described above is illustrated in FIGS. 3 and 4. In particular, FIGS. 3 and 4 illustrate that a chip pair 30 may be provided as an exemplary chip set. As shown in FIG. 3, one of the first and second chips 11 and 12 may be smaller than the other of the first and second chips 11 and 12 in at least one dimension. That is, the first chip 11 may be shorter in the longitudinal dimension than the second chip 12 as a result of the first chip 11 being fabricated differently from the second chip 12 whereby the first chip 11 is shorter than the second chip 12 or as a result of an end portion of the first chip 11 being diced. In either case, the exposed portion 21 of the second chip 12 may be used as a probe or test pad. Once probing or testing is completed, a filler 22 can be added to the first chip 11 to cover the exposed portion 21 of the second chip 12 as shown in FIG. 4.

Figure 5:
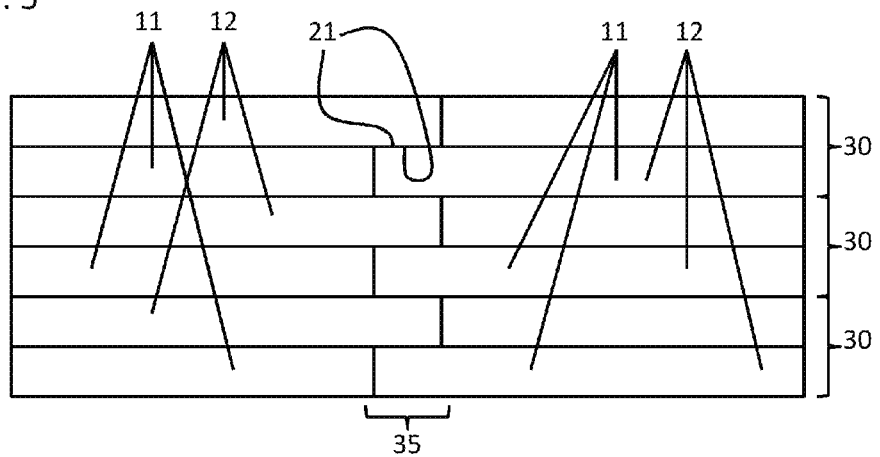
FIG. 5 is a top down view of a packaging structure in accordance with further embodiments.

In accordance with alternative embodiments, the filler 22 of FIG. 4 may not be added. Instead, with reference to FIG. 5, the exposed portion 21 of the second chip 12 may be electrically coupled to a complementarily exposed portion 21 of another second chip 12 of another adjacent chip pair 30. As shown in FIG. 5, the two chip pairs 30 cooperatively form a lap joint 35 at the complementary exposed portions 21 of the respective second chips 12. This arrangement could be repeated for each chip pair 30 in a given packaging structure such that multiple lap joints 35 are formed and such that the width, the active area and the total connections of the given packaging structure may be correspondingly increased.

Figure 6:
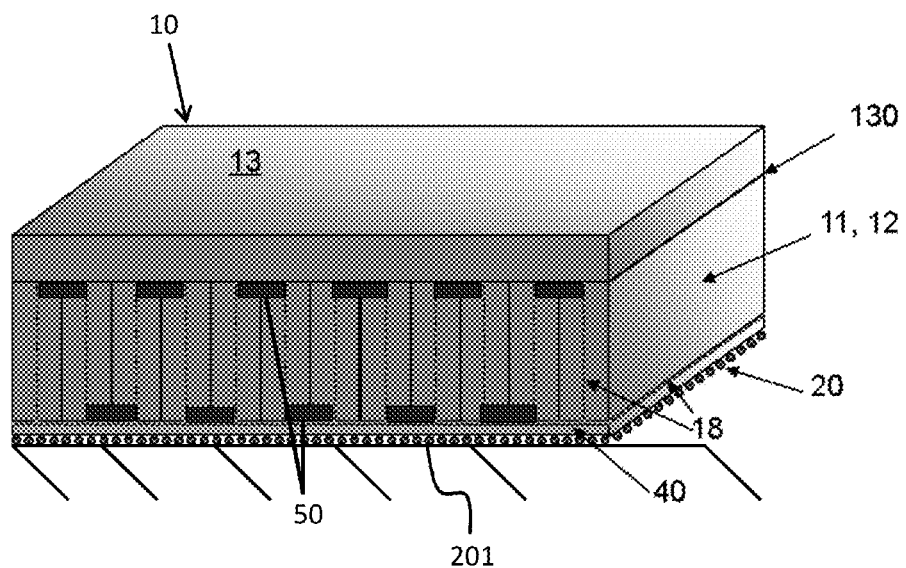
FIG. 6 is a perspective view of a packaging structure in accordance with further embodiments.

With reference to FIG. 6, the packaging structure 10 may further include a carrier chip 40. The carrier chip 40 may be electrically interconnected to respective "bottom" sidewalls 113 and 123 of the first and second chips 11 and 12 via conductive elements, such as microbumps 18, with, for example, 75 μm pitch whereby 25 μm pitch corner crossings can be used at both the respective "top" and "bottom" sidewalls 113 and 123 to thereby double the number of possible connections provided by the packaging structure 10. The carrier chip 40 may be formed of silicon and may define through-silicon-vias (TSVs) and further comprising conductive elements electrically connected to the first and second chips via the TSVs. The array of C4s 20 may be provided on the "bottom" surface of the carrier chip 40 between the packaging structure 10 and the 1$^{st}$ level package substrate 201. The use of TSVs in the carrier chip 40 may allow for the use of lower cost materials and simplification of the 1$^{st}$ level package substrate.

Still referring to FIG. 6 and, in accordance with still further embodiments, the packaging structure 10 may include "T" connectors 50. These "T" connectors 50 may be disposed along the respective "top" and/or "bottom" (i.e., long) sidewalls 113 and 123 of adjacent ones of the first and/or second chips 11 and 12 and are configured to provide for vertical and horizontal connections. The "T" connectors 50 may be formed of multi-layer ceramic, two or more joined glass/silicon interposers with wiring on one or more faces, etc. The "T" connectors 50 can be used to replace the "corner crossings" between the active chip surfaces 112 and 122 and the "top" sidewalls 113 and 123, which face the active surface 130 of the common chip 13 and the corner crossings between the active chip surfaces 112 and 122 and the "bottom" sidewalls 113 and 123, which face the carrier chip 40 in this embodiment. The "T" connectors 50 can provide electrical connections between adjacent chip pair 30 (i.e., horizontal connections) and/or between chip pairs 30 and the common top chip 13 (i.e., a combination of horizontal and vertical connections) or the carrier chip 40, or the packaging substrate 201 if no carrier chip 40 is present. The "T" connectors 50 could be connected to the respective active surfaces of the chip pair 30 (112 or 122) they are adjacent to and to the active surface 130 of the common chip 13 using microbumps 18 or C4 20 of the appropriate size and pitch. Similar connections could be made to the carrier chip 40 or the packaging substrate 201.

Figure 7:
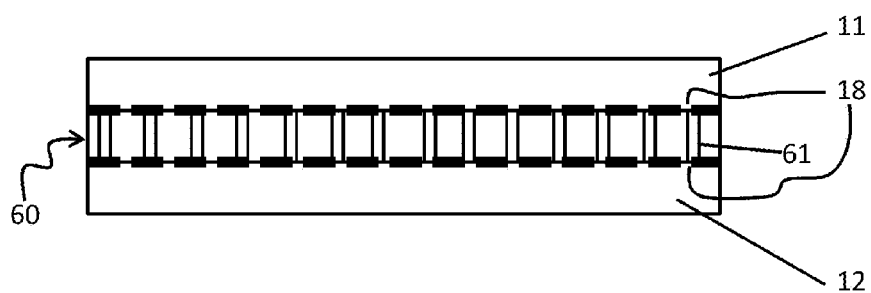
FIG. 7 is a top down view of a chip set with first and second chips and an additional chip.

Although the chip sets described above and illustrated in FIGS. 1-6 are generally referred to as chip pairs 30 or as first and second chips 11 and 12, it is to be understood that this embodiment is merely exemplary and that other arrangements of two or more chips in a given chip set are possible. That is, with reference to FIG. 7, a given chip set may include first and second chips 11 and 12 as well as one or more additional chips 60. Such additional chips 60 may be operably disposed between the first and second chips 11 and 12 and may be formed to define TSVs 61 whereby communication between the first and second chips 11 and 12 is possible. In any case, it will be further understood that the packaging structure 10 will generally include a plurality of chip sets arrayed along a length of the common chip 13 and that the individual chip sets in the packaging structure 10 may include varying numbers of chips.

With reference to FIGS. 8-11, an alternate packaging structure 1000 (see FIG. 11) may be formed with chip sets in which each of the chip sets includes two first chips 1100 and two second chips 1200. A process for assembling such a configuration will be described below.

Figure 8:
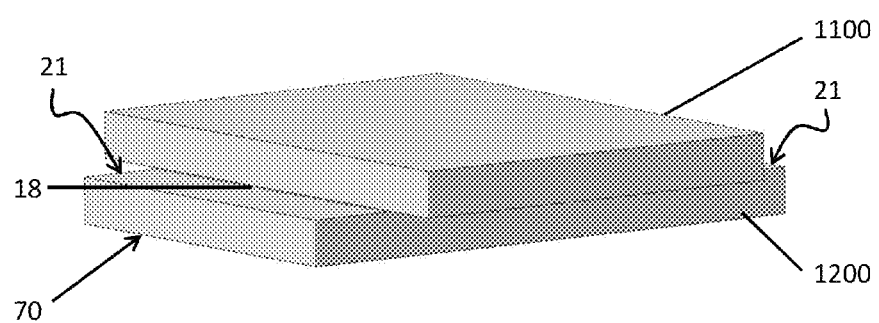
FIG. 8 is a perspective view of a first processing operation for assembling a packaging structure.
Figure 9:
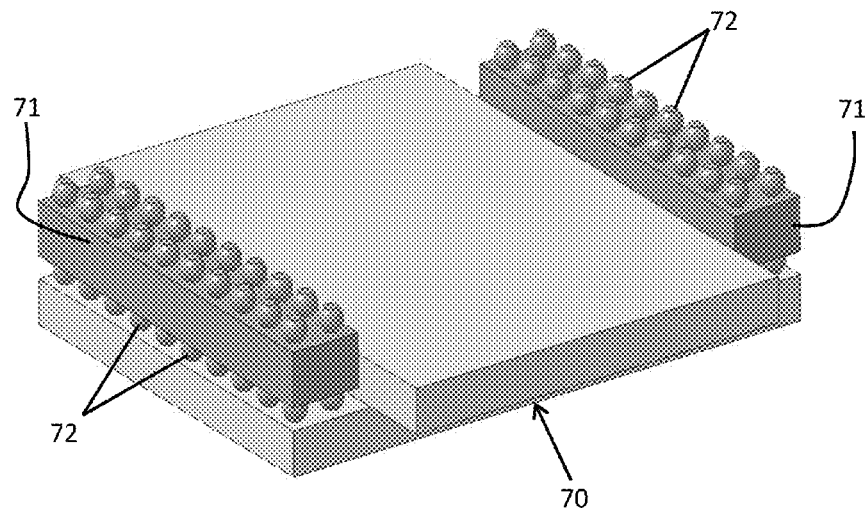
FIG. 9 is a perspective view of a second processing operation for assembling a packaging structure.

Initially, as shown in FIG. 8, first chip 1100 and second chip 1200 are electrically interconnected via microbumps 18 as described above to form a first pair 70. The first chip 1100 and the second chip 1200 are rotated 90 degrees relative to one another and are substantially rectangular in shape (although this is not required). This defines exposed portions 21 at opposite distal ends of the second chip 1200 where the opposite distal ends of the second chip 1200 extend beyond the sidewalls of the first chip 1100. As shown in FIG. 9 pass-through blocks 71 are then attached to the exposed portions 21 of the second chip 1200. The pass-through blocks 71 may be provided with solder bumps 72 or other electrical connectors that can have similar pitch characteristics as described above for a pitch of up to 100-200 μm. The pass-through blocks 71 may be formed of glass with conductive vias, silicon with conductive vias, ceramic with conductive vias, PCB/organic build up layers/flex, etc.

Figure 10:
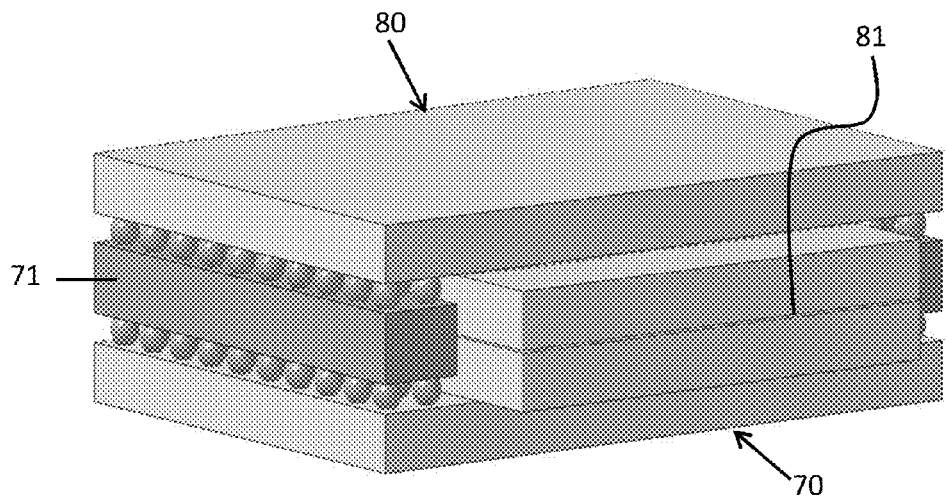
FIG. 10 is a perspective view of a third processing operation for assembling a packaging structure.
Figure 11:
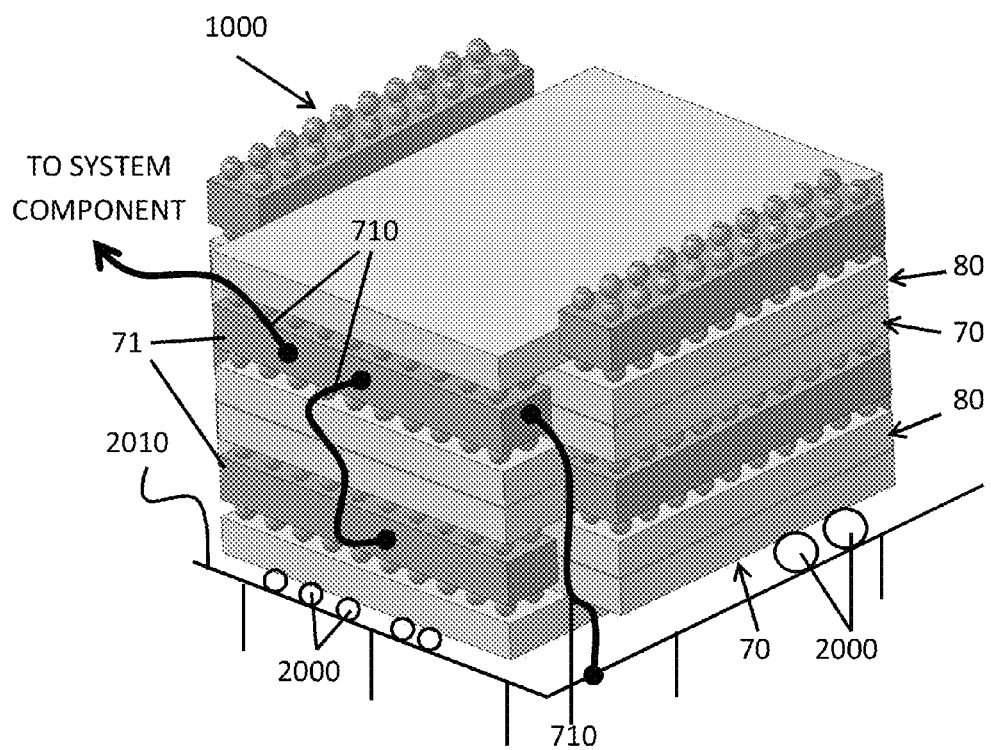
FIG. 11 is a perspective view of a fourth processing operation for assembling a packaging structure.

With reference to FIG. 10, a second pair 80 of first and second chips 1100 and 1200, which are electrically interconnected to one another via microbumps 18, may be attached to the first pair 70. The exposed portions 21 of the second chip 1200 of the second pair 80 are connected to the pass-through blocks 71 via solder bumps 72 or other electrical connectors. A thermal bonding layer 81 is formed between the two first chips 1100 of the first and second pairs 70 and 80. The thermal bonding layer may be a solder layer, filled thermal adhesive, such as silver epoxy, or epoxy filled with thermally conductive particles, such as low melting point metals or alloys. Alternatively, fluid channels could be formed on non-active major surfaces of the first and second pairs 70 and 80 and dielectric fluid may be passed through for cooling purposes. As shown in FIG. 11, the process may be continued for additional pairs.

The packaging structure 1000 shown in FIGS. 8-11 allows a chip stack to be formed with electrical connections between all the chips in the stack without the use of thru silicon vias. The downward facing surface of the "bottom" chip or the downward facing exposed portions 21 of the "top" chip in the "bottom" chip pair could be mounted to a packaging substrate 2010 using C4s 2000 to provide power and communications to the chip stack. The pass-through blocks 71 may include flex connections 710 that could be attached to the packaging substrate 2010 or elsewhere in the system, so that power and communications could be provided directly to chip pairs in the stack but not through chips and pass-through blocks lower in the stack.

For example, as shown in FIG. 11, one or more of upper pass-through blocks 71 can include a flex connection 710 that is attachable to the packaging substrate 2010. In addition, one or more of the pass-through blocks 71 may include flex connections 710 that are attachable to other pass-through blocks 71 or to system components. System components may include, but are not limited to, a circuit board, a memory device, a power source, an input/output (I/O) device and/or an electrical/optical converter.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A packaging structure, comprising:
   first and second chips;
   at least one surface of each of the first and second chips being an active surface; and
   a common chip to which a sidewall of at least one of the first and second chips is electrically interconnected, the sidewall being adjacent and transverse to the active surface;
   the respective active surfaces of the first and second chips being directly electrically interconnected to one another in a face-to-face arrangement and being oriented transversely with respect to the common chip.

2. The packaging structure according to claim 1, wherein bowing in one of the first and second chips is cancelled out by bowing in the other of the first and second chips.

3. The packaging structure according to claim 1, wherein at least one of the first and second chips comprises at least one of a voltage or power conversion device, a control device, passive devices including capacitors or inductors, or a memory device.

4. The packaging structure according to claim 1, further comprising at least one of microbumps or microjoins disposed between the first and second chips by which the respective active surfaces are directly electrically interconnected.

5. The packaging structure according to claim 1, wherein one of the first and second chips is smaller than the other of the first and second chips in at least one planar dimension,
   the at least one planar dimension being defined transversely with respect to a direction of direct electrical interconnection between the respective active surfaces of the first and second chips.

6. The packaging structure according to claim 1, further comprising a carrier chip to which the first and second chips are electrically interconnected.

7. The packaging structure according to claim 1, wherein the first and second chips are each plural in number and are provided in chip sets arranged along a length of the common chip.

8. The packaging structure according to claim 7, wherein one or more of the chip sets comprises additional chips.

9. The packaging structure according to claim 7, wherein adjacent chip sets are electrically interconnected via a lap joint,
   the lap joint comprising an overlapping of portions of opposite chips in the adjacent chip sets in a direction of direct electrical interconnection between the respective active surfaces of the first and second chips.

10. A packaging structure, comprising:
    first and second chips, each of the first and second chips including a body having two opposing surfaces and four sidewalls extending between and transversely oriented with respect to the two opposing surfaces;
    at least one of the two opposing surfaces of each of the first and second chips being an active surface; and
    a common chip to which at least one of the respective sidewalls of the first and second chips is electrically interconnected;
    the respective active surfaces of the first and second chips being directly electrically interconnected to one another in a face-to-face arrangement and being oriented transversely with respect to the common chip.

11. The packaging structure according to claim 10, wherein bowing in one of the first and second chips is cancelled out by bowing in the other of the first and second chips.

12. The packaging structure according to claim 10, wherein at least one of the first and second chips comprises at least one of a voltage or power conversion device, a control device, passive devices including capacitors or inductors, or a memory device.

13. The packaging structure according to claim 10, further comprising at least one of microbumps or microjoins disposed between the first and second chips by which the respective active surfaces are directly electrically interconnected.

14. The packaging structure according to claim 10, wherein one of the first and second chips is smaller than the other of the first and second chips in at least one planar dimension,
    the at least one planar dimension being defined transversely with respect to a direction of direct electrical interconnection between the respective active surfaces of the first and second chips.

15. The packaging structure according to claim 10, further comprising a carrier chip to which the first and second chips are electrically interconnected.

16. The packaging structure according to claim 10, wherein the first and second chips are each plural in number and are provided in chip sets arranged along a length of the common chip.

17. The packaging structure according to claim 16, wherein one or more of the chip sets comprises additional chips.

18. The packaging structure according to claim 16, wherein adjacent chip sets are electrically interconnected via a lap joint, the lap joint comprising an overlapping of portions of opposite chips in the adjacent chip sets in a direction of direct electrical interconnection between the respective active surfaces of the first and second chips.

19. A packaging structure, comprising:

chip sets of at least first and second chips;

at least one surface of each of the first and second chips of each chip set being an active surface;

the respective active surfaces of the first and second chips of each of the chip sets being directly electrically interconnected to one another in a face-to-face arrangement;

a pass-through block disposed in contact with the at least one active surface of the first chip of each chip set and the at least one active surface of the first chip of another chip set and by which the at least one active surface of the first chip of each chip set is electrically interconnected with the at least one active surface of the first chip of another chip set; and a pass-through block disposed in contact with the at least one active surface of the second chip of each chip set and the at least one active surface of the second chip of another chip set and by which the at least one active surface of the second chip of each chip set is electrically interconnected with the at least one active surface of the second chip of another chip set.

20. A packaging structure, comprising:

first and second chip sets, each chip set including at least first and second chips;

at least one surface of each of the first and second chips of each chip set being an active surface;

the respective active surfaces of the first and second chips of each of the chip sets being directly electrically interconnected to one another in a face-to-face arrangement;

a bonding layer by which the first and second chip sets are attached to one another; and pass-through blocks by which the at least one active surface of the first chip of each chip set is electrically interconnected with the at least one active surface of the first chip of another chip set and the at least one active surface of the second chip of each chip set is electrically interconnected with the at least one active surface of the second chip of another chip set.

21. The packaging structure according to claim 20, further comprising a packaging substrate to which at least a bottom chip set is interconnected through corresponding ones of the pass-through blocks.

22. The packaging structure according to claim 21, wherein one or more of upper pass-through blocks includes flex connections that are attachable to the packaging substrate.

23. The packaging structure according to claim 20, wherein one or more of the pass-through blocks includes flex connections that are attachable to system components.

* * * * *